Feb. 4, 1969

H. MANN 3,426,159

PULSE CORRECTOR

Filed Nov. 12, 1965

INVENTOR
H. MANN
BY Leonard A. Arnold (signature)
ATTORNEY

United States Patent Office 3,426,159

Patented Feb. 4, 1969

3,426,159

PULSE CORRECTOR

Henry Mann, Berkeley Heights, N.J., assignor to Bell Telephone Laboratories, Incorporated, New York, N.Y., a corporation of New York Filed Nov. 12, 1965, Ser. No. 507,458
U.S. Cl. 179—84 4 Claims
Int. Cl. H04m 1/00

ABSTRACT OF THE DISCLOSURE

Pulse stretcher circuit whose output signal persists for a minimum predetermined time interval.

Figures 1, 2:
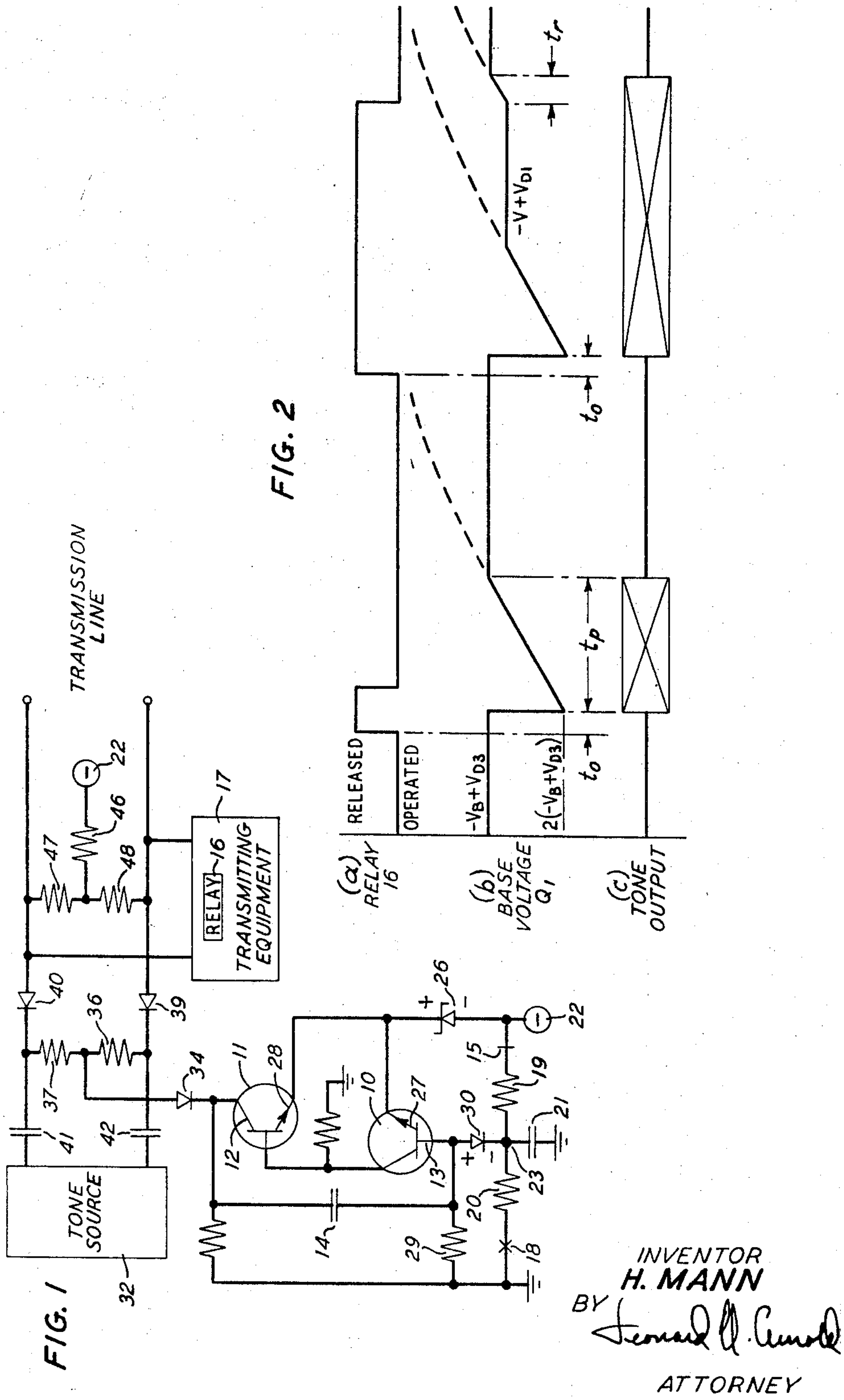

This invention relates to signal translating arrangements and more particularly relates to a pulse stretcher circuit whose output signal persists for a minimum predetermined time interval.

The processing of electrical signals often results in distortion of the signals. Such distortion may in a particular case be sufficiently severe to render the signals ill-suited to perform the task which they were originally assigned to accomplish. For example, the duration of a dial or switching pulse may be so shortened during processing that the pulse becomes totally ineffective to perform its assigned switching function. Alternatively, the shortened pulse may still be capable of switching an associated device but may be unable to maintain the device in a switched condition for a period of time sufficiently long to achieve the desired operation thereof.

Generally speaking, an ideal pulse stretcher should respond to changes of state, lasting longer than a predetermined time, in an input signal to produce a corresponding output signal whose duration is at least equal to a predetermined time interval.

Stated more specifically, for input pulses of less than a predetermined time duration the stretcher should produce no output signal. This minimum time is called the operate time, $t_o$, of the stretcher. Thus, where the duration, $t_{input}$, of the change of state in the input signal is less than $t_o$, there is no output signal. When the input pulse is greater in time duration than $t_o$ and less in time duration than a second predetermined time, $t_p$, the output signal from the pulse stretcher should be of time duration $t_p$. Finally, if the input pulse time duration is greater than $t_p$ then the output pulse should be of the same time duration as the input pulse.

Relay type pulse stretchers have long been available to accomplish these results but in some cases the pulse distortion is beyond their operating limits. More sophisticated pulse stretchers employing fast acting semiconductor devices have been developed, but they require farily complex and relatively expensive circuitry involving several interconnected timer circuits with each timer circuit employing one or more transistors.

It is therefore an object of this invention to eliminate the need for relatively expensive and complex circuitry in electronic pulse stretchers.

In accordance with this invention, the electronic pulse stretcher is formed by two transistors in a positive feedback configuration to insure that a short input pulse is lengthened to a proper predetermined time duration, $t_p$, and also employing a turn-on delay to prevent spurious operation. To compensate for the turn-on delay, a clamping circuit is provided to lock the pulse corrector circuit in the pulse output condition as long as the input pulse signal is greater in time duration than the abovementioned predetermined time. The characteristics of the clamping circuit result in the introduction of a turn-off delay substantially equal to the turn-on delay so that input pulses of time duration greater than $t_p$ are faithfully reproduced.

This invention may be more fully comprehended from the following detailed description taken in conjunction with the drawings in which:

FIG. 1 is a schematic diagram of a pulse stretcher embodying this invention; and FIG. 2 depicts various wave forms which are helpful in understanding the mode of operation of the apparatus shown in FIG. 1.

A pulse stretcher circuit embodying this invention and illustratively employed to control the application of single frequency signaling tones to a transmission line is shown in FIG. 1. (The use of a single frequency signaling in one type of telephone system is described in the Bell Laboratories Record, vol. 30, No. 7, July 1952, in an article by E. K. Van Tassel, entitled "Type N Carrier Telephone System," page 277.) The function of the pulse stretcher circuit in such an illustrative application is to insure that the pulses have a minimum predetermined time duration, $t_p$, so that the tones generated on the line are never less in time duration than that predetermined time. In addition, the pulse stretcher must possess the attributes stated above; namely, that no output signal and consequently no tone is generated for pulses of less than a predetermined operate time, $t_o$, and also that pulses greater in time duration than $t_p$ are faithfully reproduced.

The pulse stretcher comprises n-p-n type transistors 10 and 11 with positive feedback provided from the collector electrode 12 of transistor 11 to the base electrode 13 of transistor 10 by means of a capacitor 14, which insures, as will be described below, that output pulses of a minimum predetermined time duration, $t_p$, are generated in response to an input signal which is not spurious.

To prevent spurious operation of the pulse stretcher, a circuit comprising a normally closed contact 15 of a relay 16 associated with the transmitting equipment 17, normally opened contact 18 of the same relay, resistors 19 and 20 and capacitor 21, is provided. The resistors 19 and 20 and contacts 15 and 18 are connected in a series circuit between a source 22 of collector emitter bias voltage of $-V_B$ volts and ground. Contact 15 is connected between source 22 and resistor 19 and contact 18 between resistor 20 and ground. The second terminal of each resistor 19 and 20 is connected to a common junction point 23 and capacitor 21 is connected between that common junction point and ground.

Initially, that is, in the idle condition, relay 16 is operated, contact 15 is open, contact 18 is closed, capacitor 21 is discharged to ground through resistor 23, and transistor 10 is conducting and transistor 11 is not conducting. When the relay is released due to the generation of a pulse by the transmitting equipment 17, capacitor 21 charges to $-V_B$ volts through resistor 19 and contact 15. When the voltage on capacitor 21 is at approximately $-V_B+V_{D3}$ volts, where $V_{D3}$ is the voltage drop across a Zener diode 26 connected between source 22 and the emitter electrodes 27 and 28 of transistor 10 and 11, respectively, transistor 10 is turned off and transistor 11 is turned on. The elapsed time between the release of the relay 16 and the turn-on of transistor 11 is the operate time, $t_o$, of the pulse stretcher because the pulse stretcher will not respond to the release of the dial for a period of time less than this so-called operate time.

When transistor 11 turns on its collector electrode voltage immediately assumes a value which is the sum of $-V_B$ volts plus the voltage drop across the Zener diode 26. Due to the fact that the voltage across capacitor 14 cannot change instantaneously, the voltage at the base electrode 13 of transistor 10 is approximately twice that value. Capacitor 14 then commences to discharge through resistor 29 connected between ground and the base electrode 13 of transistor 10.

In accordance with this invention the discharge of capacitor 14 is determined by the state of relay 16 and the voltage drop $V_{D3}$ across Zener diode 26. If relay 16 has been reoperated and contact 15 opened by the time the voltage at the base electrode 13 of transistor 10 reaches $-V_B+V_{D1}$ volts, where $V_{D1}$ is the voltage across a diode 30 having its anode connected to the base electrode 13 of transistor 10 and its cathode connected to junction 23, then the capacitor will continue to discharge and the voltage at the base electrode 13 will continue to rise to the voltage $-V_B+V_{D3}$, at which transistor 10 conducts, and an output pulse of predetermined time duration is generated at the collector electrode 12 of transistor 11. However, if contact 15 is still closed at the time the voltage at the base electrode 13 of transistor 10 reaches $-V_B+V_{D1}$ volts then diode 30 conducts and the voltage at the base electrode 13 of transistor 10 is clamped to that voltage and transistor 10 remains nonconducting until contact 15 opens. At such time as contact 15 opens capacitor 14 continues to discharge and the voltage at the base electrode 13 of transistor 10 continues to rise until the base electrode voltage is at the same potential as the emitter electrode and transistor 10 conducts. This potential is approximately $V_{D3}$ volts more positive than the voltage at which the base electrode was temporarily clamped ($V_{D1}<<V_{D3}$), and by proper choice of Zener diode 26 the voltage $V_{D3}$ may be chosen such that the capacitor 14 is caused to discharge for a predetermined time after contact 15 is opened before return to idle condition. This time is called the release time, $t_r$, of the circuit and when the release time is equal to the operate time then input pulses of time duration greater than $t_p$ are faithfully reproduced.

The state of transistor 11 controls the transmission of signals from source 32 over the transmission line. Toward this end the collector electrode 12 of transistor 11 is connected by means of diode 34 to the junction of resistors 36 and 37 which are connected in a series circuit across the transmission line. Diodes 39 and 40 are connected between the transmission line and the series connection of resistors 36 and 37, together with capacitors 41 and 42 connected between source 32 and the resistors form a unidirectional gate. A negative voltage bias is applied from source 22 through resistors 46, 47 and 48 to the anodes of the diodes 39 and 40 rendering them nonconductive. When transistor 11 is conducting the voltage at its collector electrode drops to a voltage sufficiently negative to cause the bias voltage across diodes 39 and 40 to be overcome and signaling signals from source 32 are applied to the transmission line.

FIG. 2 depicts various wave forms which are useful in understanding the mode operation of the circuit shown in FIG. 1. The state of the relay 16 is shown in line *a* of FIG. 2 and the voltage at the base electrode 13 of transistor 10 is shown in line *b* of FIG. 2. When the relay 16 is in the operated condition the voltage at the base electrode 13 of transistor 10 is at approximately $-(V_B+V_{D3})$ volts and transistor 10 is conducting. After relay 16 has been released and capacitor 21 has charged in time, $t_o$, to approximately $-(V_B+V_{D3})$ volts transistor 10 becomes nonconductive and transistor 11 conducts. The result of this change in state is that the voltage across capacitor 14 and the voltage at the base electrode of transistor 10 instantaneously drops to approximately $-2(V_B+V_{D3})$ volts, and then begins an exponential decay toward 0 volts. In the event that the relay has been reoperated in the time interval before the base voltage reaches approximately $-V_B+V_{D1}$ volts then the capacitor continues to discharge. Transistor 10 conducts when its base electrode voltage reaches $-(V_B+V_{D3})$ volts and a pulse of standard time duration, $t_p$, is generated and a tone output of time duration, $t_p$, is generated as shown in line *c* of FIG. 2.

In order to faithfully reproduce pulses which are greater in time duration than $t_p$, which is necessary in order to transmit supervisory pulses, the release time of the circuit must be made equal to the operate time of the circuit. In accordance with this invention, the release time is a function of the voltage, $V_{D3}$ across Zener diode 26 and the manner in which this Zener diode, coupled with the clamping circuit comprising diode 30, resistor 19 and contact 16, operates is depicted in the right-hand portion of line *b* of FIG. 2. There the input pulse is illustrated as being of time duration greater than $t_p$ and as a result the relay is still in the release condition when the voltage at the base electrode of transistor 10 reaches approximately $-V_B+V_{D1}$ volts. At that time contact 15 is closed and the capacitor 14 is prevented from further discharge due to the fact that it is now clamped to voltage approximately $-V_B+V_{D1}$ volts through conducting diode 30, resistor 19 and contact 15. The voltage at the base electrode of transistor 10 remains at this value until relay 16 is operated, at which time contact 15 opens. The clamping circuit is then rendered inoperative and the capacitor continues to discharge to ground through resistor 29. As shown, the base voltage is clamped at voltage approximately equal to $-V_B+V_{D1}$ volts for a time interval lasting until the relay 16 is again operated, and upon operation of the relay the capacitor continues to discharge. When the voltage at the base electrode of transistor Q10 reaches $-(V_B+V_{D3})$ volts the circuit returns to the idle condition.

In accordance with this invention the voltage across the Zener diode determines the time it will take for the capacitor to discharge from $-V_B+V_{D1}$ volts to $-(V_B+V_{D3})$ and this time may be made equal to the operate time with the result, as shown in line *c* of FIG. 2, that input pulses of time duration greater than $t_p$ are faithfully reproduced.

Thus the complexity and cost of pulse stretchers are eliminated by a two transistor pulse stretcher embodying this invention which employs positive feedback to insure that a short pulse is lengthened to a proper predetermined time duration and also employing a turn-on delay to prevent spurious operation. To compensate for the turn-on delay, a clamping circuit is provided to lock the pulse stretcher circuit in the pulse output condition, and the characteristics of the clamping circuit result in the introduction of a turn-off delay substantially equal to the turn-on delay. The result is that input pulses of time duration greater than $t_p$ are faithfully reproduced.

It is to be understood that the above-described arrangements are illustrative of the principles of the invention. Numerous other arrangements may be devised by those skilled in the art without departing from the spirit and scope of the invention.

What is claimed is:

1. A pulse stretcher circuit responsive to the operation of a relay comprising, in combination, a first transistor and a second transistor each having a base electrode, an emitter electrode, and a collector electrode, a capacitor connecting said collector electrode of said second transistor to said base electrode of said first transistor so that said first transistor is conducting and said second transistor is nonconducting when said relay is operated, a resistance-capacitance timing circuit responsive to the release of said relay for a predetermined time to render said first transistor nonconducting and said second transistor conducting and charge said capacitor coupling said collector electrode of said second transistor to a voltage twice that which existed on said capacitor when said transistors were in their initial state when said relay was operated, means to discharge said capacitor at a predetermined rate so that said first transistor is rendered conductive after a predetermined time during which said relay was again operated, means to clamp said base electrode of said first transistor to a predetermined voltage below the level at which said first transistor is rendered conductive in the event said relay is not operated during said predetermined time, and means responsive to the operation of said relay after said predetermined time has elapsed to continue the discharge of said coupling capacitor.

2. A pulse stretcher circuit responsive to the operation of a relay comprising, in combination, a first transistor and a second transistor each having a base electrode, an emitter electrode, and a collector electrode, a capacitor connecting said collector electrode of said second transistor to said base electrode of said first transistor so that said first transistor is conducting and said second transistor is nonconducting when said relay is operated, a resistance-capacitance timing circuit responsive to the release of said relay for a predetermined time to render said first transistor nonconducting and said second transistor conducting and charge said cpacitor coupling said collector electrode of said second transistor to a voltage twice that which existed on said capacitor when said transistors were in their initial state when said relay was operated, means to discharge said capacitor at a predetermined rate so that said first transistor is rendered conductive after a predetermined time during which said relay was again operated, a contact of said relay which is closed when said relay is released and open when said relay is operated, a resistor, a diode, a source of voltage, means connecting said resistor, diode and said contact in a series circuit between said source of voltage and said base electrode of said first transistor to clamp said base electrode of said first transistor to a predetermined voltage below the level at which said first transistor is rendered conductive in the event said relay is not operated during said predetermined time, and means responsive to the operation of said relay after said predetermined time has elapsed to continue the discharge of said coupling capacitor.

3. A pulse stretcher responsive to the operation of a relay comprising, in combination, a first transistor and a second transistor each having a base electrode, an emitter electrode, an a collector electrode, a source of collector emitter bias voltage having a first terminal and a second terminal, means to provide a constant voltage drop connected between a first terminal of said source and the emitter electrodes of said transistors, means connecting the collector electrode of said first transistor to the base electrode of said second transistor, means connecting the collector electrode of said second transistor to said second terminal of said source, a first capacitor connecting said collector electrode of said second transistor to said base electrode of said first transistor so that said first transistor is conducting and said second transistor is nonconducting when said relay is operated, a first contact of said relay which is open when said relay is operated and closed when said relay is released, a second contact of said relay which is closed when said relay is operated and open when said relay is released, first and second resistors each having two terminals, a first terminal of each being connected together at a junction, means connecting the second terminal of said first resistor through said first contact of said relay to said first terminal of said source, means connecting the second terminal of the second resistor through said second contact of said relay to the second terminal of said source, a second capacitor connected between the junction of said resistors and the second terminal of said source so that said second capacitor is charged when said relay is released and after a predetermined charging time renders said first transistors nonconductive and said second transistor conductive and charges said first capacitor to a voltage twice that which existed on said capacitor when said transistors were in their initial stage when said relay was operated, means to discharge said first capacitor at a predetermined rate so that said first transistor is rendered conductive after a predetermined time during which said relay was again operated, a diode, means connecting said diode between said junction of said first and second resistors and said base electrode of said first transistor so that said base electrode of said first transistor is clamped to a voltage equal to the source voltage less the voltage across said constant voltage dropping means if said first contact is closed, and means to discharge said first capacitor after the operation of said relay.

4. Apparatus responsive to the operation of a relay for controlling the application of tone signaling signals to a transmission line comprising, in combination, a source of signaling signals, gating means connected between said signaling source and said transmission line, a pulse stretcher comprising, a first transistor and a second transistor each having a base electrode, an emitter electrode, and a collector electrode, a source of collector emitter bias voltage having a first terminal and a second terminal, a Zener diode connected between a first terminal of said source and the emitter electrodes of said transistors, a direct connection between the collector electrode of said first transistor and the base electrode of said second transistor, means connecting the collector electrode of said second transistor to said second terminal of said source, a first capacitor connecting said collector electrode of said second transistor to said base electrode of said first transistor so that said first transistor is conducting and said second transistor is nonconducting when said relay is operated, a first contact of said relay which is open when said relay is operated and closed when said relay is released, a second contact of said relay which is closed when said relay is operated and open when said relay is released, a first and a second resistor each having two terminals, one terminal of each being connected together at a junction, means connecting the second terminal of said first resistor through said first contact to said first terminal of said voltage source, means connecting the second terminal of the second resistor to the second terminal of said voltage source, a second capacitor connected between the junction of said resistors and the second terminal of said voltage source so that said second capacitor is charged when said relay is released and after a predetermined charging time renders said first transistor nonconductive and said second transistor conductive and charges said first capacitor to a voltage twice that which existed on said first capacitor when said transistors were in their initial state when said relay was operated, means to discharge said first capacitor at a predetermined rate so that said first transistor is rendered conductive after a predetermined time during which said relay was again operated, a diode, means connecting said diode between said junction of said resistors and said base electrode of said first transistor so that said base electrode of said first transistor is clamped to a voltage equal to the source voltage less the voltage across said Zener diode when said first contact is closed, means to discharge said first capacitor after the operation of said relay, and means connecting the collector electrode of said second transistor to said gating means connecting said signaling source to said transmission line to transmit signaling signals when said second transistor is conductive.

References Cited

UNITED STATES PATENTS 3,211,926 10/1965 Frysinger -------- 307—267 XR

KATHLEEN H. CLAFFY, *Primary Examiner.*

W. A. HELVESTINE, *Assistant Examiner.*

U.S. Cl. X.R.

179—16; 307—267